United States Patent [19]

Cecil

[11] Patent Number: 4,463,851
[45] Date of Patent: Aug. 7, 1984

[54] PROTECTIVE ENCLOSURE FOR ELECTRONIC DEVICES

[75] Inventor: Waldo E. Cecil, Irving, Tex.

[73] Assignee: Meritex Plastic Inc., Arlington, Tex.

[21] Appl. No.: 516,437

[22] Filed: Jul. 25, 1983

Related U.S. Application Data

[63] Continuation of Ser. No. 371,738, Apr. 26, 1982, abandoned.

[51] Int. Cl.³ .................. B65D 85/42; B65D 65/18; H05F 3/02
[52] U.S. Cl. ................. 206/328; 206/45.34; 206/334; 206/521; 220/82 R; 361/220; 383/106
[58] Field of Search .............. 206/328, 334, 45.34, 206/331, 521; 220/82 R; 361/220; 383/106

[56] References Cited

U.S. PATENT DOCUMENTS

| 1,926,066 | 9/1933 | Scholl | 383/106 |
|---|---|---|---|
| 2,323,399 | 7/1943 | Jacobi . | |
| 2,919,797 | 1/1960 | McCracken | 206/328 |
| 3,184,056 | 5/1965 | Kisor | 206/328 |
| 3,205,764 | 9/1965 | Letter | 206/45.34 |
| 3,432,380 | 3/1969 | Weber | 206/45.34 |
| 3,648,108 | 3/1972 | Bailey | 206/329 |
| 3,653,498 | 4/1972 | Kisor | 206/329 |
| 3,673,543 | 6/1972 | Garner . | |
| 3,774,075 | 11/1973 | Medesha . | |
| 3,784,957 | 1/1974 | Bailey | 206/329 |
| 4,037,267 | 7/1977 | Kisor | 206/331 |
| 4,171,049 | 10/1979 | Nohara et al. | 206/328 |
| 4,327,832 | 5/1982 | De Matteo | 206/45.34 |

FOREIGN PATENT DOCUMENTS

| 52-2284 | 1/1977 | Japan | 206/334 |
|---|---|---|---|
| WO79/00066 | 2/1979 | PCT Int'l Appl. . | |
| WO79/00011-23 | 12/1979 | PCT Int'l Appl. | 206/334 |

OTHER PUBLICATIONS

Motorola Inc., Dwg. No. 41CTD13645W Magazine, Extruded for 40 Terminal Multilayer Chip Carrier.

Primary Examiner—William T. Dixson, Jr.
Attorney, Agent, or Firm—Thomas W. Buckman

[57] ABSTRACT

A protective enclosure for electronic devices (110) includes a tube (112) formed from conductive polyvinyl chloride and comprising a bottom wall (116), side walls (122, 124) and a top wall (126). The top wall (126) includes a gap (128) to permit observation of electronic devices supported on the central portion (120) of the bottom wall (116). A transparent window (114) formed from transparent polyvinyl chloride is positioned on the outer surface of the top wall (126) and extends across the gap (128).

7 Claims, 2 Drawing Figures

PROTECTIVE ENCLOSURE FOR ELECTRONIC DEVICES

This application is a continuation application of Ser. No. 06/371,738 filed 04/26/82 now abandoned.

TECHNICAL FIELD

This invention relates to an enclosure for electronic devices which includes a transparent window permitting observation of devices contained within the enclosure while simultaneously preventing damage to the contained devices due to static electricity.

BACKGROUND AND SUMMARY OF THE INVENTION

In the handling, transportation and storage of electronic devices such as integrated circuits and the like, it is considered advantageous to house the electronic devices in protective enclosures. While various types of protective enclosures are utilized, the present invention pertains to the type in which protection is afforded not only from damage such as bending, breaking, etc. of the electronic devices, and also from damage due to static electricity.

In accordance with one type of protective enclosure for electronic devices which has gained commercial acceptance, the electronic devices are received in a tube formed from a conductive plastic material. One wall of the tube has spaced apart edges which receive a transparent window to permit observation of electronic devices housed within the tube. The window is retained by cooperating V-shaped edges extending along opposite sides of the window and along the opposed edges defining the gap in the tube. The tube further includes inwardly extending legs positioned on opposite sides of the window to prevent contact between electronic devices contained within the tube and the relatively non-conductive transparent window.

The present invention comprises an improvement over the foregoing type of protective enclosure for electronic devices. In accordance with the broader aspects of the invention, the transparent window comprises a layer overlying the entire surface of the tube having the gap formed therein. This eliminates the need for cooperating edges on the window and the tube for retaining the window, and also eliminates the need of inwardly projecting legs for maintaining separation between enclosed electronic devices and the transparent window. Protective enclosures incorporating the invention can be manufactured considerably more rapidly than the prior art type of enclosure, which results in significant cost savings.

DESCRIPTION OF THE DRAWINGS

A more complete understanding of the invention may be had by reference to the following Detailed Description when taken in conjunction with the accompanying Drawings, wherein.

DETAILED DESCRIPTION

Figure 1:
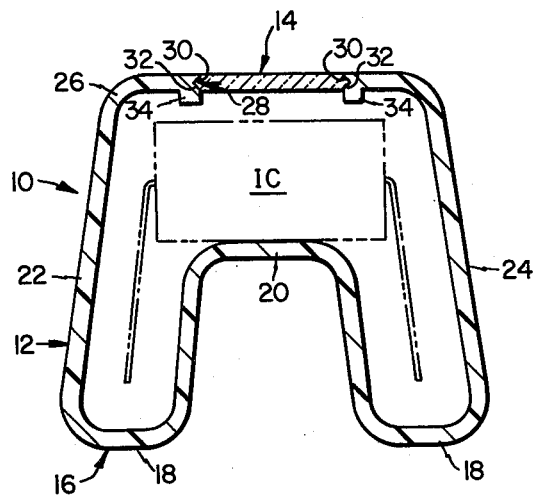
FIG. 1 is a sectional view illustrating a prior art type of protective enclosure for electronic devices.

Referring now to the drawings, and particularly to FIG. 1, there is shown a protective enclosure for electronic devices 10 of the prior art type. The protective enclosure 10 includes a tube 12 formed from conductive polyvinyl chloride and a transparent window 14 formed from transparent polyvinyl chloride. A electronic device IC of the type known as an integrated circuit is shown housed within the protective enclosure 10, although the protective enclosure 10 may also be utilized in conjunction with other types of electronic devices.

The tube 12 of the protective enclosure 10 includes a bottom wall 16. The bottom wall 16 includes outboard portions 18 which receive the leads of the electronic device IC and a raised central portion 20 which supports the electronic device by engagement with the body thereof. A pair of side walls 22 and 24 extend upwardly from the outboard portions 18 of the bottom wall 16 and serve to interconnect the bottom wall 16 and a top wall 26.

The top wall 26 comprises a gap 28. The gap 28 is defined by opposed, V-shaped edges 30 extending the entire length of the tube 12. The transparent window 14 has cooperating outwardly projecting V-shaped edges 32 which engage the V-shaped edges 30 of the top wall 26 of the tube 12 to retain the transparent window 14 in place. In addition, the window 14 is installed in the tube 12 with both the tube and the window in a heated condition, so that the conductive polyvinyl chloride of the tube and the transparent polyvinyl chloride of the window 14 to merge together, thereby further securing the window 14 and the tube 12.

The tube 12 further includes a pair of legs 34 which project downwardly from the inside surface of the top wall 26. The legs 34 are positioned on opposite sides of the edges 30 defining the gap 28 in the top wall 26, and extend the entire length of the tube 12.

Those skilled in the art will appreciate the fact that the transparent polyvinyl chloride comprising the window 14 is substantially less electrically conductive than the conductive polyvinyl chloride comprising the tube 12. Therefore, there exists at least the possibility that a charge of static electricity could build up on the transparent window 14 should this occur, and further assuming that the electronic device IC were to come into contact with the transparent window 14, the charge of static electricity on the transparent window 14 could damage the electronic device. The purpose of the legs 34 of the protective enclosure 10 is therefore to maintain complete separation between the electronic device IC and the transparent window 14, thereby assuring that the electronic device will not be damaged by static electricity that might tend to build up on the transparent window 14.

Figure 2:
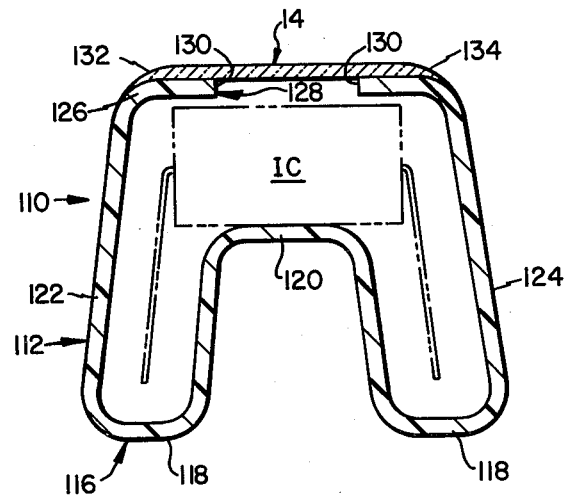
FIG. 2 is a view similar to FIG. 1 illustrating the present invention.

Referring now to FIG. 2, there is shown a protective enclosure 110 incorporating the present invention. The protective enclosure 110 includes a tube 112 which is preferably formed from conductive polyvinyl chloride and a transparent window 114 which is preferably formed from transparent polyvinyl chloride. It will be understood, however, that other types of conductive thermoplastic materials may be utilized in the fabrication of the tube 112, and that other types of transparent thermoplastic materials may be utilized in the fabrication of the transparent window 114, if desired. For example, conductive polypropylene may be used to form the tube 112.

The tube 112 includes a bottom wall 116. The bottom wall 116 is divided into outboard portions 118 and a central portion 120 positioned substantially above the outboard portions 118. A electronic device IC of the type known as an integrated circuit is shown supported on the central portion 120 of the bottom wall 116 with the leads of the electronic device extending downwardly into the outboard portions 118. Those skilled in the art will appreciate the fact that the tube 112 may be configured for use with other types of electronic devices. In such cases the shape and the relative positioning of the various component parts of the bottom wall 116 may be varied in order to match the configuration and dimensions of a particular electronic device. In particular, when the present invention is used to form protective enclosures for electronic devices of the leadless type, the bottom wall 116 of the tube 112 is entirely flat and does not include a raised central portion.

The tube 112 further includes a pair of side walls 122 and 124 extending upwardly from the bottom wall 116. The side walls 122 and 124 extend between the bottom wall 116 and a top wall 126 which defines the top of the tube 112. The top wall 126 comprises a gap 128 positioned over the central portion 120 of the bottom wall 16 and defined by opposed edges 130 extending the entire length of the tube 112. The purpose of the gap 128 and the transparent window 114 is to permit observation of electronic devices housed within the protective enclosure 110 and supported on the central portion 120 of the bottom wall 116 thereof.

The transparent window 114 comprises a layer of transparent thermoplastic material extending across the outer surface of the top wall 126 of the tube 112. In the particular embodiment of the invention shown in FIG. 2 the window 114 is provided with outer edges 132 and 134 which are tapered downwardly to blend into the upper ends of the side walls 122 and 124, respectively. However, the use of the tapered edges 132 and 134 of the window 114 is not necessary to the practice of the invention. The edges of the window 114 may have any desired shape, and window 114 may be substantially narrower than the overall width of the top wall 126 of the tube 112, if desired.

Since the window 114 is not supported between the edges 130 defining the gap 128 of the top wall 126, the edges 130 need not have any particular shape. The edges 130 are shown in FIG. 2 as extending perpendicularly to the outer and inner surfaces of the top wall 126, however, the edges 130 may be tapered, rounded, or otherwise configured in accordance with the requirements of particular applications of the invention. Additionally, since the window 114 is positioned on the outer surface of the top wall 126, separation between the electronic device IC and the transparent window 114 is maintained by the thickness of the top wall 126. The use of legs, such as the legs 34 of the tube 12 of the protective enclosure 10 shown in FIG. 1, is therefore unnecessary in the practice of the present invention.

The tube 112 of the protective enclosure 110 of the present invention is preferably manufactured by the extrusion process. Likewise, the transparent window 14 is preferably manufactured by extrusion. The transparent window 114 is positioned on the outer surface of the top wall 126 of the tube 112 while both the tube and the window are in a substantially heated state. This causes the material of the tube and the material of the window to merge or fuse together, thereby securely bonding the transparent window 114 to the conductive tube 112 without the necessity of additional adhesives or bonding steps.

It will be appreciated that since the protective enclosure 110 is manufactured without the necessity of positioning the transparent window 114 between the edges 130 defining the gap 128 of the top wall 126 of the tube 112, the manufacture of the protective enclosure 110 proceeds much more rapidly when compared with the rate of manufacture of the protective enclosure 10 shown in FIG. 1. By this means the cost of manufacturing the protective enclosure for electronic devices of the present invention is substantially reduced.

Since the protective enclosure 110 is manufactured entirely by the extrusion process, individual enclosures incorporating the invention may have any desired length. However, a length of several inches is perhaps typical. Additionally, individual protective enclosures are frequently provided with spaced apart sets of aligned holes extending through the transparent window 114 and the central portion 120 of the bottom wall 116 of the tube 112. The purpose of the holes is to receive and retain plastic nails which in turn serve to prevent electronic devices received within the protective enclosure from sliding out of the ends thereof.

Although preferred embodiments of the invention have been illustrated in the accompanying Drawings and described in the foregoing Detailed Description, it will be understood that the invention is not limited to the embodiments disclosed but is capable of numerous rearrangements, modifications, and substitutions of parts and elements without departing from the spirit of the invention.

I claim:

1. A protective enclosure for electronic devices comprising:
    an elongate tube formed from a rigid conductive thermoplastic material and comprising a bottom wall, side walls extending upwardly from the bottom wall, and a top wall including portions extending inwardly from each of the side walls;
    the top wall of the tube being characterized by a gap defined by spaced apart edges extending the entire length of the tube; and
    a layer of transparent rigid thermoplastic material mounted on the outer surface of the top wall of the tube and extending across the gap formed therein creating double thickness top wall sections for reinforcing a portion of the top wall of the tube adjacent the gap and extending laterally outwardly toward the side walls while permitting observation of electronic devices enclosed within the tube through the gap and central portion of the transparent layer of thermoplastic material.

2. The protective enclosure for electronic devices according to claim 1 wherein the bottom wall of the tube is further characterized by at least one outboard portion and a central portion positioned beneath the gap in the top wall and a predetermined distance of the outboard portion of the bottom wall for supporting electronic devices thereon.

3. The protective enclosure for electronic devices according to claim 2 wherein the tube is formed from conductive polyvinyl chloride and the transparent window is formed from transparent polyvinyl chloride.

4. A protective enclosure for electronic devices comprising:
    an elongated tube formed from a rigid conductive thermoplastic material and comprising a bottom wall including opposed outboard portions and a central portion positioned substantially above the outboard portions for supporting a electronic device extending downwardly into the outboard portions, side walls extending upwardly from the outboard portions of the bottom wall, and a top wall including portions extending inwardly from the upper ends of the side walls;

the tube being further characterized by a gap formed in the top wall above the central portion of the bottom wall and defined by spaced apart edges extending the entire length of the tube; and a window formed from rigid transparent thermoplastic material positioned on the outer surface of the top wall and extending across the gap formed therein and onto at least upper surfaces of the top wall adjacent the gap for enclosing and reinforcing the top wall portions while permitting observation of electronic devices supported on the central portion of the bottom wall, said spaced apart edges preventing electronic devices from contacting the window.

5. The protective enclosure for electronic devices according to claim 4 wherein the transparent window extends the entire width of the tube and is further characterized by outer edges which are tapered downwardly and merged into the upper ends of the side walls.

6. The protective enclosure for electronic devices according to claim 4 wherein the tube is formed from conductive polyvinyl chloride.

7. The protective enclosure for electronic devices according to claim 4 wherein the transparent window is formed from transparent polyvinyl chloride.

* * * * *